United States Patent [19]

Lal et al.

[11] Patent Number: 5,693,197
[45] Date of Patent: Dec. 2, 1997

[54] DC MAGNETRON SPUTTERING METHOD AND APPARATUS

[75] Inventors: Brij Bihari Lal, Fremont; Allen J. Bourez, San Jose, both of Calif.; Tadashi Shinohara, Niiharu-gun, Japan

[73] Assignee: HMT Technology Corporation, Fremont, Calif.

[21] Appl. No.: 319,862

[22] Filed: Oct. 6, 1994

[51] Int. Cl.$^6$ .................................................. C23C 14/34
[52] U.S. Cl. ............................ 204/192.2; 204/192.15; 204/298.08
[58] Field of Search ..................... 204/298.08, 298.26, 204/192.12, 192.2, 192.15

[56] References Cited

U.S. PATENT DOCUMENTS

| | | | |
|---|---|---|---|
| 3,461,054 | 8/1969 | Vratny | 204/298.08 X |
| 4,392,931 | 7/1983 | Maniv et al. | |
| 4,880,514 | 11/1989 | Scott et al. | 204/192.2 |
| 4,931,169 | 6/1990 | Scherer et al. | 204/298.08 X |
| 4,981,566 | 1/1991 | Wurczinger | 204/298.08 X |
| 5,147,734 | 9/1992 | Nakamura et al. | |
| 5,180,426 | 1/1993 | Ishibashi et al. | 204/298.08 X |
| 5,244,554 | 9/1993 | Yamagata et al. | 204/192.2 |
| 5,292,417 | 3/1994 | Kugler | 204/298.08 X |

OTHER PUBLICATIONS

Fisher, R.D., et al., "Effect of Rf Substrate Bias on Crystalline Orientation of Chromium and Magnetic Characteristics of 84% Co–16% Cr Films," *IEEE Trans. on Magn.* 26(1):109 (1990).

Ohkoshi, M., and Kusuda, T., "Effect of Negative Substrate Bias on the Film Structure and Magnetic Properties in Sputter–Deposited Co–Cr Films," *J. Var. Sci. Tech.* 5(5):2859 (1987).

Pressesky, J., et al., "Crystallography and Magnetic Properties of CoCrTa Films Prepared on Cr Underlayers with Different Substrate Conditions," *J. Appl. Phys.* 69(8):5163 (1991).

Lu, M., et al., "Effects of Rf Bias on the Texture, Magnetics, and Recording Properties of Rf sputtered CoCr/Cr Longitudinal Thin Film Media," *IEEE Trans. on Magn.* 26(5):1581 (1990).

Shiroishi, Y., et al., "Read and Write Characteristics of Co–Alloy/Cr Thin Films for Longitudinal Recording," *IEEE Trans. on Magn.* 24(6):2730 (1988).

Werner, A., et al., "Sputtered Co–Cr Films: Effect of Substrat Bias Voltage on Cr Concentration," *IEEE Trans. on Magn.* pp. 1885 (1988).

*Primary Examiner*—Nam Nguyen
*Attorney, Agent, or Firm*—Judy M. Mohr; Peter J. Dehlinger

[57] ABSTRACT

A method of producing a magnetic recording medium by sputtering a layer onto a substrate by DC-magnetron sputtering from a target while exposing the target to an RF signal is described. The RF signal is effective to extend the target utilization without significantly decreasing the sputtering rate. Also disclosed is an apparatus for use forming a medium in accordance with the method of the invention.

4 Claims, 5 Drawing Sheets

DC MAGNETRON SPUTTERING METHOD AND APPARATUS

FIELD OF THE INVENTION

The present invention relates to an improved method of DC-magnetron sputtering, and to an apparatus for practicing the method.

REFERENCES

Lu, M., et al., *IEEE Trans. Magn.*, 26(5), 1581 (1990).
Maniv, S., et al., U.S. Pat. No. 4,392,931
Nakamura, K., et al., U.S. Pat. No. 5,147,734
Ohkoshi, M., et al., *J. Vac. Sci. Technol.*, 5(5) 2859 (1987).
Ohring, M., *The Materials Science of Thin Films*, Academic Press, Inc., San Diego, Calif., 1992.
Pressesky, J., et al., *J. Appl. Phys.*, 69(8) 5163 (1991).
Werner, A., et al., *IEEE Trans. Magn.*, p. 1885 (1988).

BACKGROUND OF THE INVENTION

Thin-film magnetic recording media or discs are manufactured by depositing a series of layers, such as an underlayer, a magnetic recording layer and a protective overlayer, on a substrate disc. Deposition of the layers can be carried out by a variety of procedures. The most common of these is sputtering, in which a sputter target is excited by ion and electron bombardment in a low-pressure atmosphere, generating a plasma that leads to atom deposition on a substrate.

In a sputtering operation, a gas—typically argon—is introduced into the sputtering chamber to serve as a medium in which gas discharge is initiated and sustained. By placing a negative bias on the target, positive ions in the discharge are drawn to the cathodic plate, where they eject neutral atoms through momentum transfer. These atoms pass through the discharge region to be deposited on a substrate. Additional particles, including negative ions, are also discharged from the target, and may be accelerated toward the substrate, to bombard the film being deposited.

The sputtering plasma can be focused, to achieve greater plasma density and stability, by applying a magnetic field across the target. This approach, known as magnetron sputtering, leads to higher sputtering rates, but has the limitation of creating a racetrack pattern of bombardment of the target, which in turn reduces target lifetime and target utilization efficiency.

The negative bias on the target may be applied by a DC voltage or an RF (radio-frequency) alternating voltage. In DC sputtering, also known as cathodic sputtering, a negative DC voltage of typically between −200 to −800 V is applied to the target, with the other electrode connected to the sputtering chamber ground. At a threshold argon pressure, a sufficient number of ions are generated and a current sufficient to sustain the target plasma is established. DC sputtering is almost always carried out in a magnetron sputtering mode.

DC magnetron sputtering is characterized by high sputtering rates, which are proportional to the power consumed, and to the square of the current density, and inversely dependent on electrode spacing. DC magnetron sputtering is limited, however, by relatively poor target utilization, due to high concentration of bombardment in a target racetrack region.

RF sputtering was developed as a means for depositing a film from an insulating target, such as $SiO_2$, but has been used as well for producing films from conductive metal targets, such as Cr and Co-based magnetic medium targets (Ohring). In this method, an RF frequency voltage, typically at a 13.56 MHz frequency, is applied to target and substrate electrodes. At the RF frequency, a large electron current is drawn to the target during each positive half of the cycle. However, only a relatively small ion current is induced during the negative half of the cycle, due to the much lower mobilities of positive ions. The net result (due to capacitive coupling between the RF power supply and target) is the induction of a net negative bias on the target. RF sputtering may be carried in the presence (RF magnetron sputtering) or absence (RF diode sputtering) of an external magnetic field applied to the target.

RF diode sputtering is hampered by low sputtering rates, but target utilization is quite high, due to the relatively even bombardment of the target in the absence of a magnetic field. In the presence of a focusing magnetic field (RF magnetron sputtering), sputtering rate is enhanced somewhat, but with some loss in target utilization.

The nature of a film deposited by sputtering can be effected not only by target deposition conditions, but also by substrate variables, such as temperature and substrate bias. A number of studies have shown the ability to effect crystal grain size and orientation of a deposited layer by applying a DC or RF bias to a substrate, where the deposited film is formed by either DC or magnetron sputtering (Ohkoshi, Pressesky, Lu, Nakumura, Fisher, Werner, Shiroshi). However, the basic limitations of DC or RF sputtering, in terms of target utilization or sputtering rates, are not significantly altered by variations in substrate bias.

It would therefore be desirable to produce a sputtering configuration which has the advantage of a high sputtering rate achievable with DC magnetron sputtering, and relatively high target utilization achievable with RF magnetron sputtering, without the limitations of either approach.

SUMMARY OF THE INVENTION

The invention includes, in one aspect, an improvement in a method for producing a magnetic recording medium formed by depositing a magnetic film layer over an underlayer on a substrate, by DC-magnetron sputtering from a target, where the target is preferably a magnetic-based target. The improvement includes applying an RF-frequency voltage to the target during target-layer deposition. The RF signal is effective to enhance target utilization, as measured by useful lifetime of the target at a given sputtering rate, without significantly decreasing the sputtering rate achievable by DC-magnetron sputtering alone.

The applied DC voltage is preferably between 300–700 volts, and the RF signal has an RMS voltage in the range of 400–2,000 volts, and a preferred frequency of 450 KHz, at a total power of between about 600–1,000 watts.

In one embodiment, the target is a cobalt-based alloy, and deposition of the alloy in the presence of an RF signal is effective to increase the coercivity of a magnetic recording medium produced by the method by at least 10%.

In another aspect, the invention includes an improvement in a sputtering apparatus for use in sputtering a recording medium layer on a substrate, by DC-magnetron sputtering of a material from a target. The improvement includes means for applying an RF voltage to the target, at a voltage level effective to increase the target utilization, as measured by useful lifetime of the target at a given sputtering rate, without significantly decreasing the sputtering rate achievable by DC-magnetron sputtering alone.

These and other objects and features of the invention will be more fully appreciated when the following detailed description of the invention is read in conjunction with the accompanying drawings.

DETAILED DESCRIPTION OF THE INVENTION

Section I below describes a modified sputtering apparatus for DC/RF sputtering in accordance with the method of the invention. DC/RF sputtering means DC magnetron sputtering in which an RF negative bias is also applied to the target. The RF signal is at a level to enhance target utilization significantly, and preferably, at a level which does not significantly reduce the sputtering rate achievable by DC magnetron sputtering alone.

Section II describes the magnetic recording properties of media formed on metallic and non-metallic substrates in accordance with the method of the invention.

A. Sputtering With Combined DC/RF Target Bias

Figure 1:
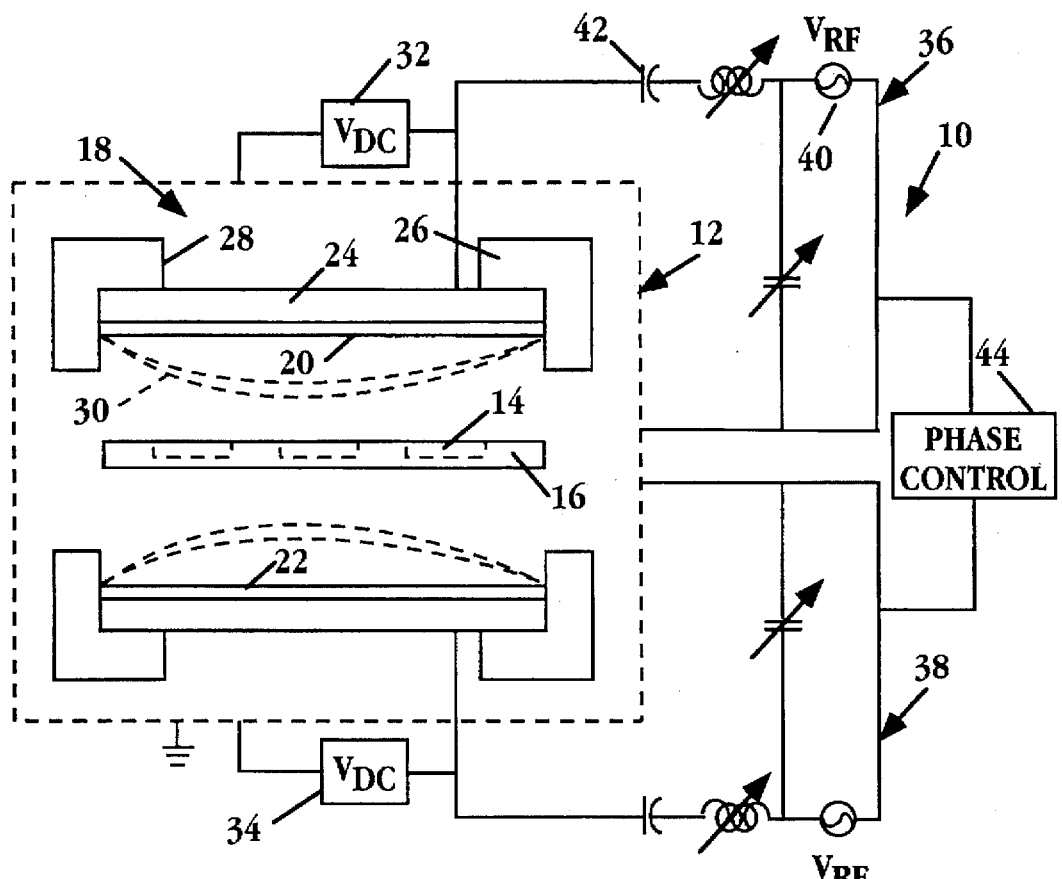
FIG. 1 is a schematic illustration of a sputtering station in a sputtering apparatus used in practicing the method of the invention, showing DC and RF voltage sources employed in the apparatus.

FIG. 1 shows, in schematic view, a portion of a sputtering apparatus 10 which has been modified for DC/RF magnetron sputtering in accordance with the invention. The apparatus includes a vacuum chamber housing, indicated by dotted lines at 12, having at least four stations at which sputtering or heating operations occur. A heating station (not shown) at the upstream end of the chamber has a plurality of infrared lights which are arrayed for heating both sides of a substrate, such as substrate 14, carried through the station in the chamber on a tray 16. The discs on the tray are supported on the tray for sputtering on both sides of the substrates, as shown.

Downstream of the heating station is one or more sputtering stations, such as station 18 shown in the figure, at which thin-film media layers, such as a chromium underlayer and a Co-based magnetic layer, are deposited on the substrates. For purposes of illustration, it is assumed that the chamber shown is designed for depositing a Co-based alloy, such as a Co/Cr/Ta alloy for forming the magnetic layer in a thin-film medium. It will be understood that chambers employed for producing other layers, such as a Cr underlayer or a carbon overcoat layer, may be similarly modified for DC/RF sputtering.

Extending through the apparatus is a conveyor system (not shown) which carries disc-support trays, such as tray 16, into and through each chamber, at a selected speed for depositing a desired layer on the substrates being moved through the chamber. The conveyor system and trays supported thereon may be conductively connected to the chamber housing, which itself is electrically grounded. Alternatively, the tray and/or supported substrates may be electrically insulated from the chamber, and biased to a selected biasing voltage by a DC or RF substrate-biasing source (not shown).

Sputtering station 18 includes a pair of sputtering targets 20, 22, for target deposition on upper and lower sides of the substrates in the figure, respectively. Target 20, which is representative, is supported on an electrically conductive backing plate 24 which is electrically insulated from the chamber. The plate and target are bounded by opposite magnetic poles 26, 28, which act to set up magnetic field lines, such as indicated by dotted lines 30, across the surface of the target. The magnetic poles may be associated with permanent or electromagnets, which are also referred to herein a magnetic means. The target configuration just described, including the magnetic poles for magnetron sputtering are of conventional design.

As described in co-owned patent application Ser. No. 08/275,836, the magnetic means may be oriented with the magnetic poles on opposite side regions of an associated target, with the polarity of each pole being opposite in a directly confronting target portion. This arrangement produces magnetic field lines between directly confronting portions of opposed targets while retaining the magnetic field created across the target surface.

The basic sputtering apparatus so far described may be a commercial system, such as in available from Varian (Santa Clara, Calif.), Circuits Processing Apparatus (Fremont, Calif.), ULVAC (Japan), Leybald Heraeus (Germany), VACTEC (Boulder, Colo.), or Materials Research Corporation (Albany, N.Y.). These Systems are double-sided, in-line, high-throughput machines having two interlocking systems, for loading and unloading. The commercial system may be modified, as indicated above, to produce a desired pole orientation, such as the one producing magnetic field lines between confronting portions of target 20, 22.

With continued reference to FIG. 1, apparatus 10 also includes DC power supplies 32, 34 associated with targets 20, 22, respectively, in chamber 18. The power supplies are conventionally designed for applying a selected cathodic voltage to the targets, preferably in the range −100 to −1,000 volts, and typically between −300 to −700 volts. The anodic side of each power supply is connected to the chamber ground, as indicated.

The apparatus also includes RF power sources 36, 38, associated with targets 20, 22, respectively in chamber 18.

RF power source 36, which is representative, includes a conventional RF generator 40 for producing a selected alternating-current voltage in the range preferably between about 400–2,000 RMS volts, at a preselected frequency, preferably 450 KHz or 13.56 MHz. Generator 40 is connected to the target through a capacitor 42 which prevents current flow from the target to generator, and at its other electrode, to the chamber ground. The RF circuit includes tunable impedance-matching capacitance/inductance components, as indicated. The two RF power sources for targets 20, 22, may be phase controlled by a suitable control device 44.

According to an important feature of the invention, the cathodic voltage applied to each target during sputtering is a combined DC/RF voltage produced by the two power sources associated with each target.

In operation, the sputtering process conditions, such as sputtering pressure and temperature, are controlled and each of the DC power supplies is adjusted to apply a selected DC voltage, preferably in the range −200 to −700 volts, to the associated target. The magnetic field strength may be adjusted at this point to ignite the plasma. After plasma ignition, the RF sources are adjusted to apply to each target an RF voltage, with an RF signal at a preferred frequency of 450 KHz or 13.56 MHz, and at a selected RMS voltage level between about 400–2,000 V to produce a desired total target between 600–10,000 Watts, depending on target size. The tuning elements in the RF sources are adjusted for impedance matching with the target DC sources to reduce reflected power. The total power level may be adjusted, if necessary, to produce a desired power level at the targets.

Table 1 below shows the sputtering rate and target utilization for DC magnetron sputtering, RF diode and RF magnetron sputtering, and for DC/RF sputtering, using power levels as indicated above and conventional cobalt alloy targets. Sputtering rate was measured by the measuring film thickness accumulation on a substrate/unit time. Target utilization is expressed in terms of percent total target remaining when the target becomes unusual because of racetrack erosion.

TABLE 1

| Sputtering System | Sputtering Rate (Å/KW min) | Target Utilization |
| --- | --- | --- |
| DC-magnetron | 433 | 20–25% |
| RF-Diode | 85 | 80–85% |
| RF-Magnetron | 114 | 35–40% |
| DC/RF | 345 | 35–40% |

As seen from the table, the combined DC/RF voltage applied to the target is effective to maintain the high sputtering rate from the target, seen with DC magnetron sputtering alone, but also to significantly improve target utilization to a level consistent with RF magnetron sputtering alone. Thus the DC target component is effective to sustain a high plasma current, as evidenced by high sputtering rate, and the RF component is effective to provide more uniform ion bombardment of the target, and thus more uniform target erosion.

B. Improved Thin-Film Medium Characteristics

In accordance with another aspect of the invention, it has been discovered that a thin-film magnetic recording medium formed by combined DC/RF target sputtering has improved recording properties, particularly significantly higher coercivity.

Figure 2:
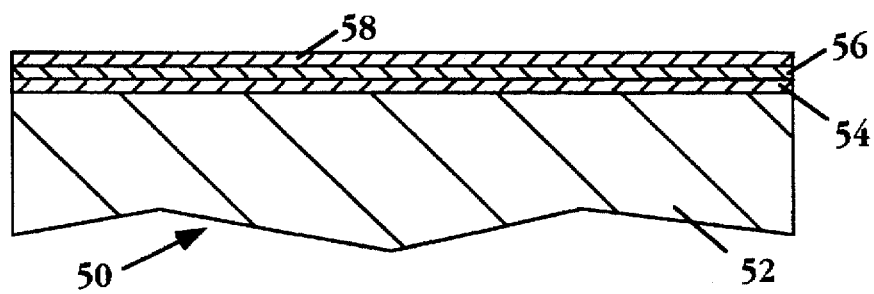
FIG. 2 shows a portion of a thin-film magnetic medium whose characteristics can be enhanced in accordance with the method of the invention.

FIG. 2 shows in cross sectional view, a fragmentary portion of a thin-film medium whose underlayer and magnetic recording layer were formed by combined DC/RF magnetron sputtering. The medium generally includes a rigid disk-like substrate 52, and forming successive thin-film layers over the substrate, a crystalline underlayer 54, a magnetic film layer 56, and a protective overcoat 58.

The substrate may be a metallic material, such as a conventional surface-coated, textured aluminum substrate of the type used commonly for digital recording medium. Alternatively, the substrate may be composed of a non-metallic material, such as textured glass, ceramic, glass-ceramic, carbon, silicon nitride, silicon carbide or a heat-resistant polymer.

The sputtered crystalline underlayer is preferably a sputtered chromium underlayer having a thickness between about 300–3,000 Å. Chromium-containing alloys, such as CrV, CrGd and CrSi may also be suitable underlayer materials, as may be a tungsten underlayer.

The magnetic thin-film layer is preferably formed of a cobalt-based alloy, that is an alloy containing at least 50% cobalt. Exemplary thin-film alloys include binary alloys and ternary alloys, such as Co/Cr, Co/Ni, Co/Cr/Ta, Co/Ni/Pt, or Co/Cr/Ni, and quaternary and five-element alloys, such as Co/Ni/Cr/Pt, Co/Cr/Ta/Pt, Co/Cr/Ta/Pt/B, or Co/Cr/Ni/Pt/B. In one embodiment, the magnetic layer is composed of a Co/Ni/Cr alloy containing 60–70 atomic percent cobalt, 20–35 atomic percent nickel, and 5–10 atomic percent chromium. In another embodiment, the cobalt-based alloy is a Co/Cr/Ta alloy, containing 80–90 atomic percent cobalt, 5–15 atomic percent chromium, and 1–10 atomic percent tantalum.

The overcoat in the magnetic recording medium is formed by sputter deposition onto the magnetic recording layer. The overcoat may be composed of carbon, silicon oxide, silicon nitride, or other suitable material giving wear-resistant, protective properties to the medium.

It will be appreciated that the medium described is exemplary and media having other configurations, such as multiple recording layers separated by a nonmagnetic isolation layer, or media having additional underlayers, can also be formed by the method of the invention.

1. Medium Formed on Metallic Substrate

In one exemplary method, a thin-film medium was formed on a Ni/P-plated aluminum substrate by DC-magnetron sputtering in the presence of an RF signal, in accordance with the method of the invention. The magnetic recording layer was composed of either CoCrTa (88:8:4) or CoNiCr (62.5:30:7.5) and was deposited onto a 350 Å thick chromium underlayer. The DC target power was between 250–400 Watts and the RF signal was 800 Watts at 450 KHz.

Figure 3:
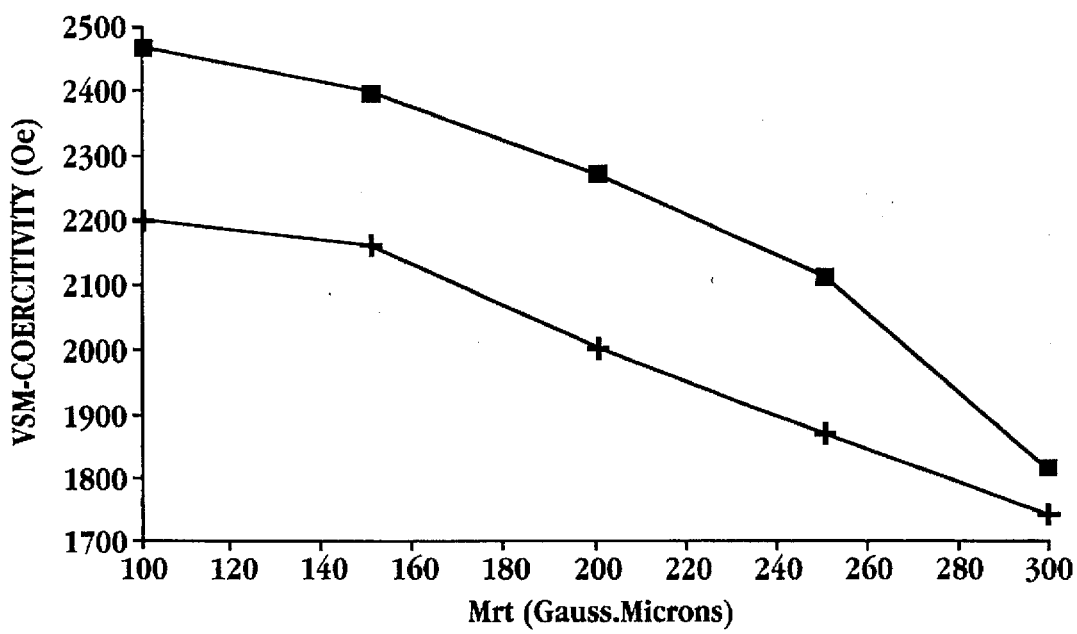
FIG. 3 is a plot of coercivity, in Oe, as a function of $M_r t$, in Gauss-microns, for media formed by DC sputtering (+) and by DC sputtering in combination with an RF signal (■)
Figure 4:
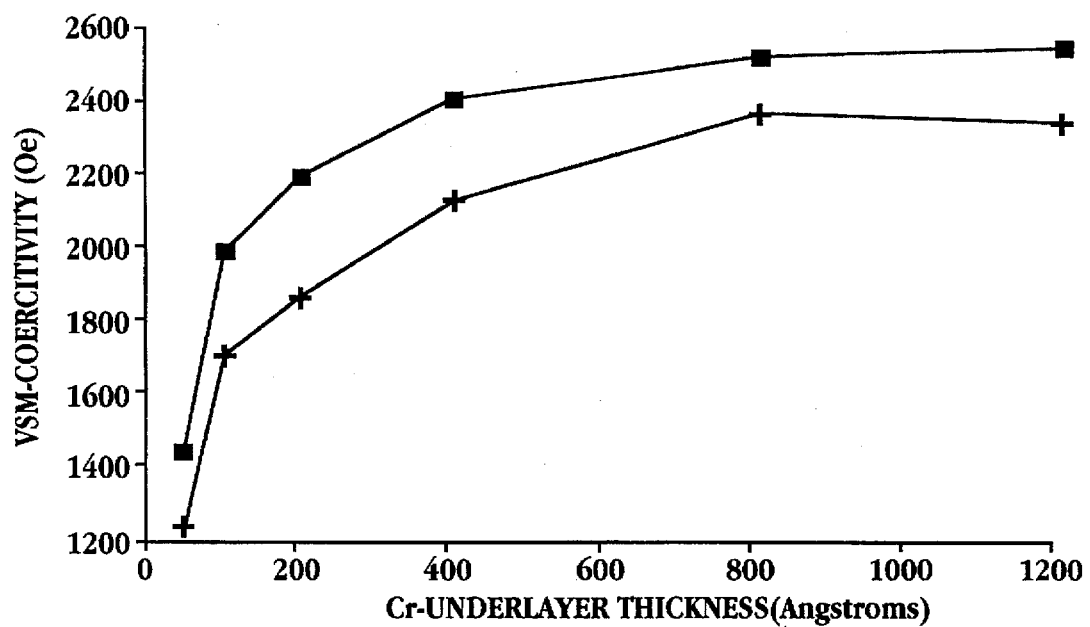
FIG. 4 is a plot of coercivity, in Oe, as a function of thickness of the chromium underlayer, in Å, for media formed by DC sputtering (+) and by DC sputtering in combination with an RF signal (■)
Figure 5:
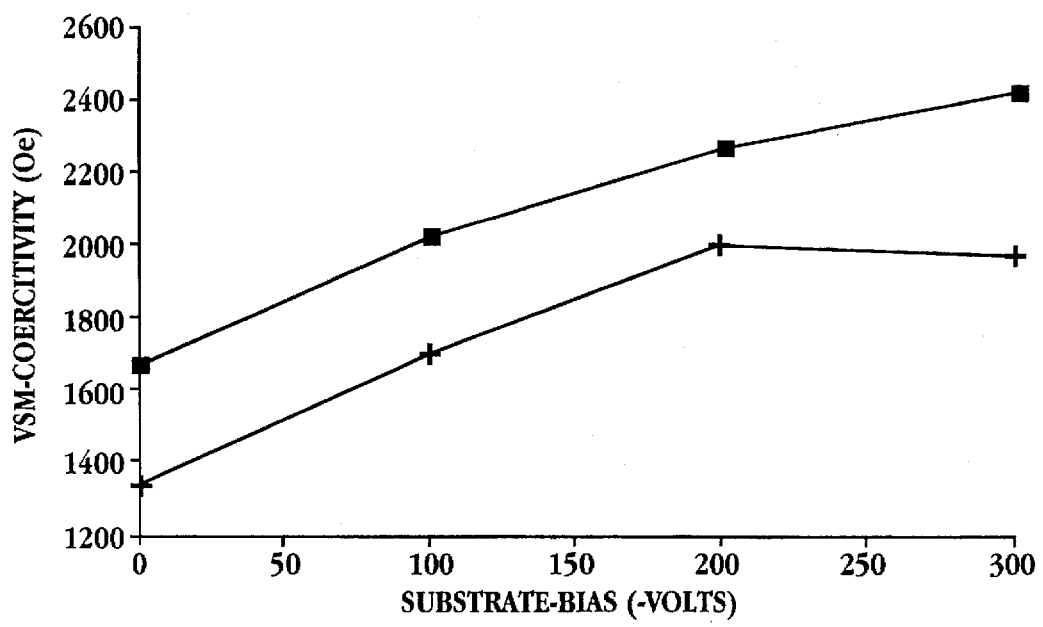
FIG. 5 is a plot of coercivity, in Oe, as a function of substrate bias, in volts, for media formed by DC sputtering (+) and by DC sputtering in combination with an RF signal (■)

Table 2 and FIGS. 3–5 show magnetic properties for media having a magnetic recording layer composed of CoCrTa (88:8:4) and formed by DC-magnetron sputtering or by DC/RF sputtering, that is DC-magnetron sputtering in the presence of an RF signal. Table 2 shows that the static magnetic properties, squareness ratio and coercive-squareness, for media formed by the two methods are the same. The orientation ratio and magnetic remanence are slightly higher for the medium formed with a combined DC and RF power input. Importantly, the coercivity of the medium formed with the combined DC and RF sputtering processes is 23% higher than the medium formed by DC-magnetron sputtering alone.

TABLE 2

| Magnetic Property | DC-magnetron | DC-magnetron + RF |
|---|---|---|
| Coercivity (Oe) | 1996 | 2451 |
| Squareness-Ratio (Mr/Ms) | 0.85 | 0.85 |
| Coercive-Squareness (S*) | 0.78 | 0.18 |
| Orientation-Ratio (Mr:cir/Mr:rad) | 1.2 | 1.34 |
| Mrt(Gauss.Microns) | 149 | 155 |

FIGS. 3–5 show coercivity as a function of magnetic remanence thickness, (FIG. 3), thickness of the chromium underlayer (FIG. 4) and substrate bias (FIG. 5), for media formed by DC-magnetron sputtering (+) and by combining DC-magnetron and RF sputtering (■). Depositing the magnetic recording layer by DC/RF sputtering results in a higher coercivity than sputtering by DC-magnetron alone.

Table 3 shows the parametrics for media formed on a NiP-plated aluminum substrate and having a CoNiCr (62.5:30:7.5) magnetic recording layer. The media were formed by either DC-magnetron sputtering or by DC-magnetron sputtering in the presence of an RF signal, at 800 W and 450 KHz. The coercivity of the medium formed by DC/RF sputtering has a 15% higher coercivity, with improvements also achieved in HF signal amplitude, resolution and overwrite.

TABLE 3

| Sputtering Method | Coer-civity (Oe) | HF (uV) | Res. (%) | OW (−dB) | PW50 (ns) | BS (ns) | DC-SNR (dB) |
|---|---|---|---|---|---|---|---|
| | | | | ID:R = 0.78" (HF: 11.2 MHz) | | | |
| DC only | 1408 | 243 | 55 | 27.7 | 56.8 | 11 | 21.0 |
| DC + 800 W RF 450 KHz | 1621 | 266 | 75.3 | 32.4 | 50.1 | 11 | 21.9 |

Figure 6:
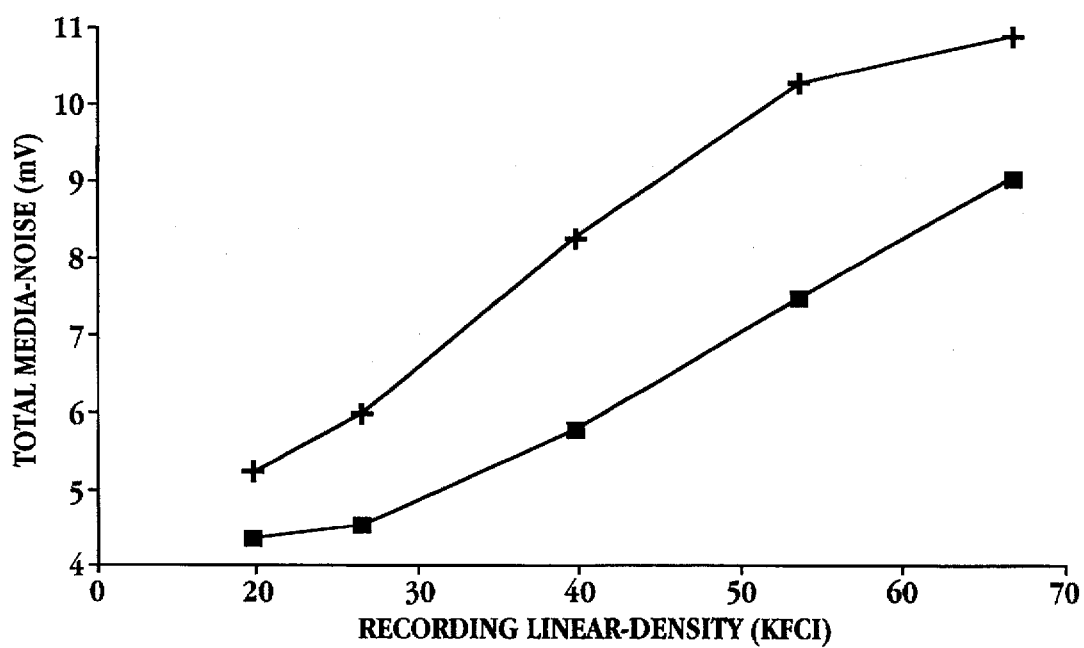
FIG. 6 shows total media noise, in mV, as a function of recording linear density, in KFCI, for media formed on a NiP/Al substrate by DC-magnetron sputtering (+) and by DC-magnetron combined with RF sputtering (■)

FIG. 6 shows total media noise, in mV, as a function of recording linear density, in KFCI, for media formed by DC-magnetron sputtering (+) and by DC-magnetron combined with RF sputtering (■). The magnetic recording layer is composed of CoNiCr (62.5:30:7.5). The media noise for the medium formed in accordance with the invention is lower over the entire recording density range tested.

Figure 7:
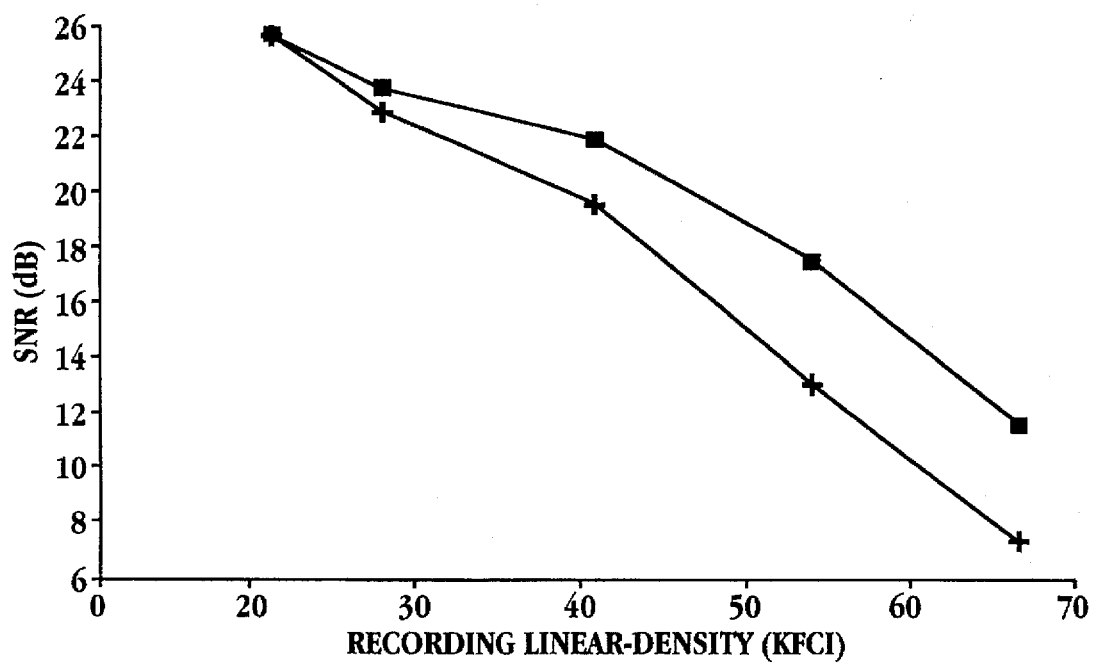
FIG. 7 is a plot showing signal-to-noise ratio, in dB, as a function of recording linear density, in KFCI, for media formed on a NiP/Al substrate by DC-magnetron sputtering (+) and by DC-magnetron combined with RF sputtering (■)

FIG. 7 is a similar plot, showing signal-to-noise ratio. Here, the signal-to-noise ratio is higher for the medium formed by DC-magnetron sputtering in the presence of an RF signal.

2. Medium Formed on a Non-metallic Substrate

This section describes the magnetic properties of media formed on glass and Canasite ceramic substrates. The magnetic film was deposited onto a 350 Å thick chromium underlayer by DC-magnetron sputtering in the presence of an RF signal, in accordance with the method of the invention. Media were formed on glass substrates with a magnetic recording layer composed of CoNiCr (67:25:8). Media formed on Canasite ceramic substrates had a magnetic recording layer of CoNiCr (62.5:30:7.5).

Table 4 shows the static magnetic properties of media formed on a glass substrate by either DC-magnetron sputtering alone or by RF-magnetron sputtering alone. Magnetic remanence thickness, HF signal amplitude, media noise, and signal-to-noise ratio are essentially the same for the two media, indicating that the sputtering processes yield similar media, at least for media formed on a glass substrate and having a CoNiCr magnetic recording layer deposited on a chromium underlayer.

TABLE 4

| Property | DC-magnetron Sputtering | RF-magnetron Sputtering |
|---|---|---|
| Coercivity (Oe) | 2100 | 2140 |
| Mrt(G.um) | 150 | 165 |
| HF-Amplitude (mV)* | 78 | 75 |
| Media-Noise (mV)* | 3.3 | 3.4 |
| SNR (dB)* | 27.5 | 27.0 |

*Values taken at 60 KFCl.

Table 5 shows the parametrics of media formed on a Canasite substrate and with a magnetic recording layer composed of CoNiCr (62.5:30:7.5) deposited by either DC-magnetron sputtering or by DC-magnetron in the presence of 800 W, 450 KHz RF signal. The medium formed with the combined sputtering processes has a coercivity that is 22% higher than the medium formed by DC-magnetron sputtering alone. Improvements are also achieved in HF signal amplitude, resolution, overwrite and bit shift.

TABLE 5

| Sputtering Method | Coer-civity (Oe) | HF (uV) | Res. (%) | OW (−dB) | PW50 (ns) | BS (ns) | DC-SNR (dB) |
|---|---|---|---|---|---|---|---|
| | | | | ID:R = 0.78" (JF: 11.2 MHz) | | | |
| DC-Magnetron | 1225 | 183 | 47.3 | 29.6 | 65.1 | 11.1 | 18.2 |
| DC + 800 W RF 450 KHz | 1488 | 218 | 68.3 | 31.2 | 54.4 | 11 | 20.1 |

Figure 8:
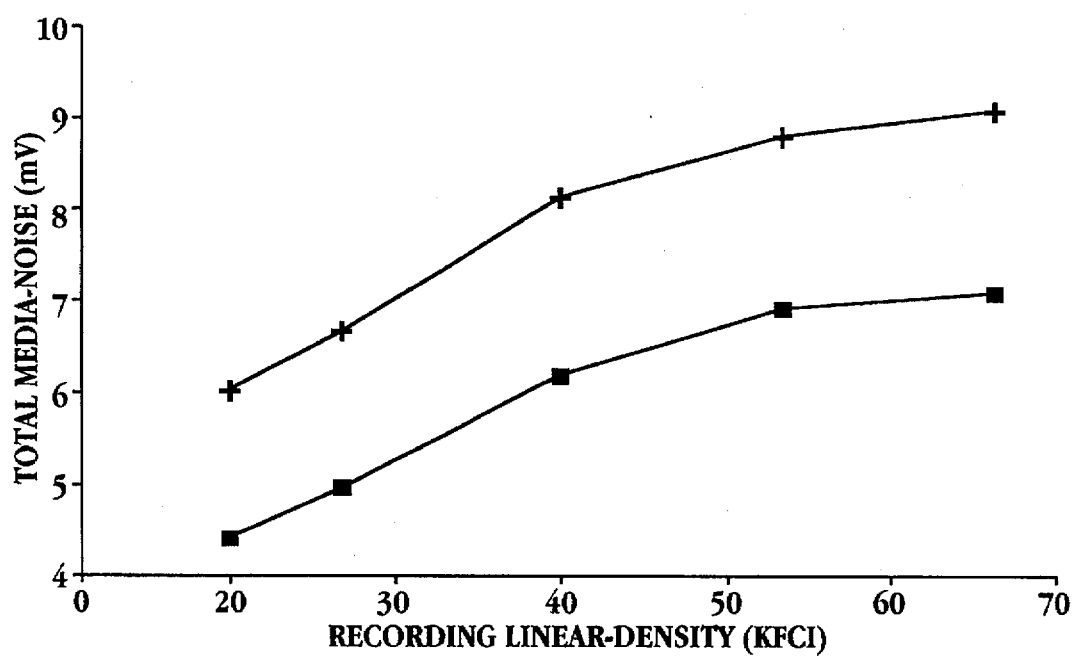
FIG. 8 shows total media noise, in mV, as a function of recording linear density, in KFCI, for media formed on a Canasite substrate by DC-magnetron sputtering (+) and by DC-magnetron combined with RF sputtering (■)
Figure 9:
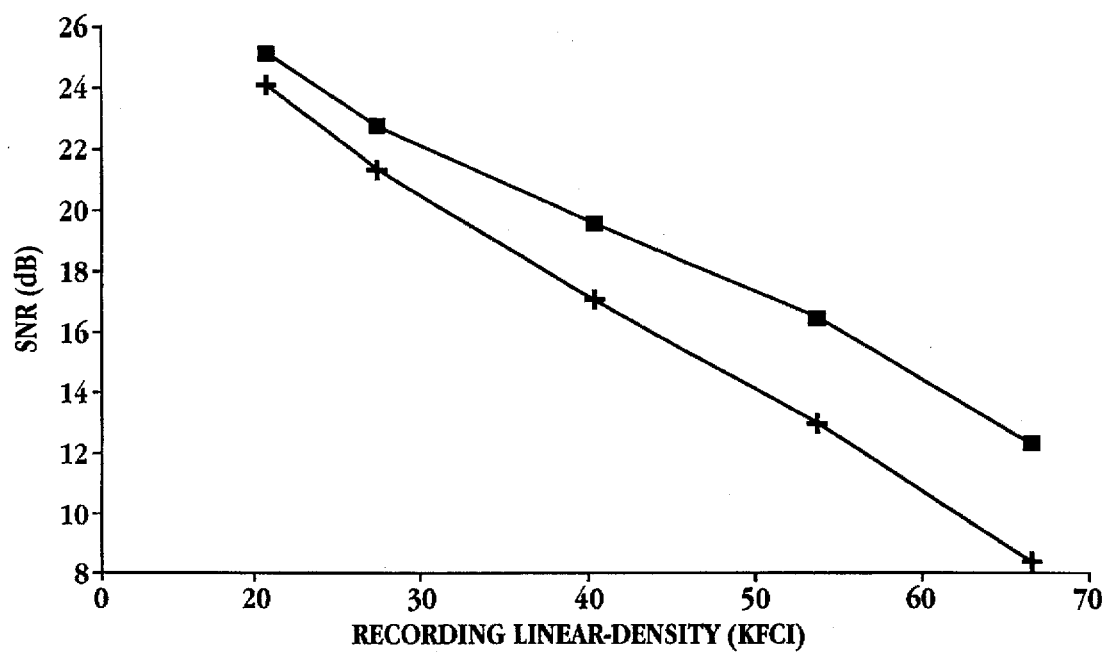
FIG. 9 is a plot showing signal-to-noise ratio, in dB, as a function of recording linear density, in KFCI, for media formed on a Canasite substrate by DC-magnetron sputtering (+) and by DC-magnetron combined with RF sputtering (■).

FIGS. 8 and 9 show total media noise (FIG. 8) and signal-to-noise ratio (FIG. 9) for media formed on a Canasite substrate with a CoNiCr magnetic recording layer. Media formed by DC-magnetron sputtering in the presence of an RF signal (■) have lower media noise and higher signal-to-noise ratio than media formed by DC-magnetron sputtering alone (+).

From the foregoing, it can be appreciated how various objects and features on the invention are met. In the method of the invention, a magnetic recording medium is formed by sputtering a layer onto a substrate by DC-magnetron sputtering from a target while exposing the target to an RF signal. The RF signal is effective to extend the target utilization without significantly decreasing the sputtering rate. The RF signal is also effective to increase the coercivity of the magnetic recording medium.

Although the invention has been described with respect to particular embodiments, it will be apparent to those skilled in the art that various changes and modifications can be made without departing from the invention.

It is claimed:

1. In a method for producing a magnetic recording medium formed by depositing a magnetic film layer over an underlayer on a substrate, by DC-magnetron sputtering from a target, an improvement comprising, during said depositing, exposing the target to an RF signal effective to increase the coercivity of a magnetic recording medium by at least 10%.

2. The method of claim 1, wherein said target is composed of a cobalt-based alloy.

3. The method of claim 1, wherein said DC-magnetron sputtering is at a voltage of between 300–700 volts.

4. The method of claim 1, wherein said RF signal has a signal amplitude in the range of 400–2,000 volts.

* * * * *